United States Patent
Kumar et al.

(10) Patent No.: US 10,983,372 B2
(45) Date of Patent: Apr. 20, 2021

(54) FAST-SWITCHING ELECTRO-OPTIC MODULATORS AND METHOD OF MAKING THE SAME

(71) Applicant: REDLEN TECHNOLOGIES, INC., Saanichton (CA)

(72) Inventors: Francis Joseph Kumar, Victoria (CA); Saied Taherion, Victoria (CA); David Giles, Victoria (CA); Jason MacKenzie, Victoria (CA)

(73) Assignee: REDLEN TECHNOLOGIES, INC., Saanichton (CA)

( * ) Notice: Subject to any disclaimer, the term of this patent is extended or adjusted under 35 U.S.C. 154(b) by 449 days.

(21) Appl. No.: 16/035,801

(22) Filed: Jul. 16, 2018

(65) Prior Publication Data

US 2019/0018264 A1    Jan. 17, 2019

Related U.S. Application Data

(60) Provisional application No. 62/532,742, filed on Jul. 14, 2017.

(51) Int. Cl.
 *G02F 1/03* (2006.01)
 *H01L 33/32* (2010.01)
 (Continued)

(52) U.S. Cl.
 CPC .......... *G02F 1/0305* (2013.01); *G02F 1/0316* (2013.01); *H01L 21/02* (2013.01);
 (Continued)

(58) Field of Classification Search
 CPC .... G02F 1/0121; G02F 1/015; G02F 2203/12; G02F 1/0018; G02F 1/017;
 (Continued)

(56) References Cited

U.S. PATENT DOCUMENTS 3,446,966 A  *  5/1969  Peterson ................... G02F 1/03
                                                           359/246
3,747,022 A  *  7/1973  Nanamatsu ........... G02F 1/0018
                                                           359/276

(Continued)

FOREIGN PATENT DOCUMENTS

EP          1285309 A       7/2006

OTHER PUBLICATIONS

Bell, R. O., "Review of optical applications of CdTe," Revue de Physique Appliquee, vol. 12, No. 2, pp. 391-399, (1977).

(Continued)

*Primary Examiner* — Evelyn A Lester
(74) *Attorney, Agent, or Firm* — The Marbury Law Group PLLC

(57) ABSTRACT

An electro-optic modulator includes a doped semiconductor crystal having a crystallographic surface having an amplitude modulation orientation, a first metal electrode located on a first surface of the doped semiconductor crystal, a second metal electrode located on a second surface of the doped semiconductor crystal, and accumulation space charge regions located within surface regions of the doped semiconductor crystal that are proximal to the first metal electrode and the second metal electrode and including excess charge carriers of a same type as majority charge carriers of the doped semiconductor crystal.

21 Claims, 6 Drawing Sheets

(51) Int. Cl.
| | |
|---|---|
| *H01L 33/50* | (2010.01) |
| *H01L 33/44* | (2010.01) |
| *H01L 21/02* | (2006.01) |
| *H01L 31/0216* | (2014.01) |
| *H01L 33/36* | (2010.01) |
| *G02F 1/015* | (2006.01) |
| *H01L 31/0232* | (2014.01) |
| *G02F 2/02* | (2006.01) |
| *H01L 33/00* | (2010.01) |
| *G02F 1/00* | (2006.01) |
| *G02F 1/35* | (2006.01) |
| *G02F 1/355* | (2006.01) |
| *H01L 33/02* | (2010.01) |
| *H01L 31/02* | (2006.01) |
| *H01L 31/0224* | (2006.01) |
| *H01L 27/146* | (2006.01) |
| *G02F 1/01* | (2006.01) |
| *G02F 1/017* | (2006.01) |

(52) U.S. Cl.
CPC ............ *H01L 33/325* (2013.01); *H01L 33/44* (2013.01); *H01L 33/50* (2013.01); *G02F 1/0018* (2013.01); *G02F 1/015* (2013.01); *G02F 1/017* (2013.01); *G02F 1/0121* (2013.01); *G02F 1/03* (2013.01); *G02F 1/0327* (2013.01); *G02F 1/3501* (2013.01); *G02F 1/3551* (2013.01); *G02F 1/3556* (2013.01); *G02F 2/02* (2013.01); *G02F 2201/12* (2013.01); *G02F 2202/10* (2013.01); *G02F 2202/106* (2013.01); *G02F 2202/32* (2013.01); *G02F 2203/12* (2013.01); *H01L 27/14625* (2013.01); *H01L 27/14685* (2013.01); *H01L 31/02002* (2013.01); *H01L 31/0224* (2013.01); *H01L 31/0232* (2013.01); *H01L 31/02161* (2013.01); *H01L 31/02327* (2013.01); *H01L 31/022408* (2013.01); *H01L 33/005* (2013.01); *H01L 33/0008* (2013.01); *H01L 33/0012* (2013.01); *H01L 33/0091* (2013.01); *H01L 33/02* (2013.01); *H01L 33/36* (2013.01)

(58) Field of Classification Search
CPC ...... G02F 2202/32; G02F 1/0316; G02F 1/03; G02F 2202/10; G02F 1/3501; G02F 2201/12; G02F 1/3551; G02F 1/3556; G02F 2/02; G02F 1/0305; G02F 1/0327; G02F 2202/106; H01L 27/14685; H01L 31/02327; H01L 33/0012; H01L 21/02; H01L 27/14625; H01L 31/02002; H01L 31/0224; H01L 31/0232; H01L 31/022408; H01L 31/02161; H01L 33/0008; H01L 33/36; H01L 33/02; H01L 33/325; H01L 33/44; H01L 33/005; H01L 33/0091; H01L 33/50

USPC ........................ 359/245, 248–259, 276–279; 257/183–196

See application file for complete search history.

(56) References Cited

U.S. PATENT DOCUMENTS

| | | | | |
|---|---|---|---|---|
| 3,900,246 | A * | 8/1975 | Kimura | G02F 1/0018 359/251 |
| 3,955,880 | A * | 5/1976 | Lierke | G02F 1/21 359/291 |
| 4,884,044 | A * | 11/1989 | Heywood | G02F 1/0305 359/245 |
| 6,319,430 | B1 * | 11/2001 | Bordui | C01G 33/00 252/584 |
| 6,396,618 | B1 * | 5/2002 | Esener | G02F 1/0322 359/245 |
| 7,099,069 | B2 | 8/2006 | Lappettini et al. | |
| 7,288,332 | B2 * | 10/2007 | Findikoglu | C03C 14/008 428/446 |
| 7,955,992 | B2 | 6/2011 | Chen et al. | |
| 8,446,657 | B2 * | 5/2013 | Quetschke | G02F 1/03 359/251 |
| 8,514,475 | B2 * | 8/2013 | Deri | G02F 1/0311 359/254 |
| 9,202,961 | B2 | 12/2015 | Chen et al. | |
| 9,575,340 | B2 * | 2/2017 | Eissler | G02F 1/0136 |
| 2003/0161022 | A1 * | 8/2003 | Lazarev | G02F 1/065 359/245 |
| 2004/0179775 | A1 * | 9/2004 | Seguin | H01S 3/115 385/31 |
| 2005/0083566 | A1 * | 4/2005 | Zappettini | G02F 1/0305 359/322 |
| 2011/0273762 | A1 * | 11/2011 | Nugent | G02F 1/0305 359/322 |
| 2015/0205147 | A1 * | 7/2015 | Jundt | G02F 1/0311 372/12 |
| 2015/0221812 | A1 * | 8/2015 | Reese | H01L 21/02562 438/95 |

OTHER PUBLICATIONS

Franc, J. et al., "Control of electric field in CdZnTe radiation detectors by above-bandgap light," Journal of Applied Physics, vol. 117, pp. 165702-1 to 165702-7, (2015).

Maldonado, T. A., "Electro-Optic Modulators," Handbook of optics vol. 2—Electro-Optic Modulators, McGraw-Hill Inc., Department of Electrical Engineering, the University of Texas at Arlington, Texas, 35 pages, (1995).

Odkhuu, D. et al., "Atomic and electronic structure of CdTe/metal (Cu, Al, Pt) interfaces and their influence to the Schottky barrier," Journal of Applied Physics, vol. 120, pp. 185703-1 to 185703-8, (2016).

* cited by examiner

FAST-SWITCHING ELECTRO-OPTIC MODULATORS AND METHOD OF MAKING THE SAME

FIELD

The present invention generally relates to the field of optical signal modulation and switching, and particularly to the field of electro-optic switches employing a semiconductor crystal such as cadmium telluride or cadmium zinc telluride. Furthermore, the present invention relates to the majority carrier type and surface states of such a semiconducting crystal, and electrical contacts applied to such a semiconducting crystal.

BACKGROUND

Cadmium telluride (CdTe) single crystals and Cadmium Zinc Telluride (CZT) single crystals exhibit high electro-optic coefficients and a wide infrared (IR) transmission wavelength range. For this reason, CdTe single crystals and (CZT) single crystals are the materials of choice for electro-optic modulators and switches in the near IR to long IR wavelengths. In these crystals, the electro-optic effect is realized either by amplitude modulation or by frequency modulation. The crystal is cut in specific directions which provide the maximum amplitude modulation and/or frequency shifting effects. For amplitude modulation (AM), single crystal bars are cut such that the light propagates in the <110> direction and metal electrodes are applied on the $(1\bar{1}0)$ surfaces as illustrated in FIG. 1. FIG. 2 shows an alternative configuration disclosed in R. O. Bell, "Review of optical applications of CdTe"; Revue de Physique Appliquee, 12 (2), pp. 391-399 (1977). In the configuration of FIG. 2, the optic axis is in <211> direction and the metal electrodes are applied on the (111) surfaces albeit at lower modulation efficiencies. A key benefit of electro-optic modulators is that very high modulation frequency can be achieved which are not otherwise possible. For example, acousto-optic modulation frequencies are lower than the modulation frequencies provided by electro-optic modulators as discussed in T. A. Maldonado, "Handbook of optics Vol. 2—Electro-Optic Modulators," McGraw-Hill Inc., (1995).

Semiconductors or semi-insulators such as CdTe, CZT and Gallium Arsenide (GaAs) absorb photon energies in the near infrared (NIR) frequency ranges close to the band edge region, and generate photon-induced charge carriers in the crystal bulk. With the application of an electric field, the electrons and holes move towards the positive and negative terminals respectively and constitute the photo current. Presence of impurities and lattice defects in the crystal disturb the periodicity of the lattice and create energy levels in the forbidden energy gap. These defect levels appear as either positively charged or negatively charged in ionized state and act as traps or recombination centres for electrons or holes respectively. They thus reduce the mobility and life time of the charge carriers under bias and detrimental to applications which require fast charge carrier transport. The probability of trapping and/or recombination depends on the density of these traps and the capture cross-section of each trap. Furthermore, the de-trapping time depends on the position of the energy level occupied by the trap in the forbidden gap.

In general, charge carriers trapped in shallow levels which are located closer to the conduction band minimum and the valance band maximum de-trap fast. But traps located deep into the forbidden gap near the mid-gap can have long de-trapping time of the order of several milliseconds. The resulting volume spatial charge distribution due the charge carriers trapped or recombined at deep levels creates an opposite electric field to the applied electric field. This is called space charge induced polarization effect, whose magnitude will increase with increase in the absorbed photon flux and will reduce with the magnitude of the applied voltage. At large enough optical fluxes (such as at $10^8$-$10^9$ photons per $mm^2$ per second) and photogenerated carrier densities, the space charge field can counter balance, or even overwhelm, the applied electric field. At such conditions, the electric field in the volume of the semiconductor can collapse and the crystal will no longer be birefringent.

European Patent No. EP 1285309 A1 to Boffi et al. describes a CZT based electro-optic modulator, and discloses that $Cd_xZn_{1-x}Te$ with x in the range of 0.8 to 0.95 unexpectedly experience only slight or no polarisation or auto-inhibition effect near the band edge, i.e., in a wavelength band of about 1,000 nm to 1,650 nm.

U.S. Pat. No. 7,099,069 B2 to Zappetini et al. describes a method of eliminating the space charge polarization effects in a $Cd_{1-x}Zn_xTe$ (where x ranges from 0.07 to 0.1) based electrooptic modulator that operates in the band edge region, i.e., in a wavelength band of about 1,000 nm to 1,650 nm. Zappetini et al. disclose that by holding the semiconducting crystal at a temperature higher than the room temperature (i.e., in the range of 50° C.-150° C.), the deleterious effects of the space charge polarization can be eliminated. The underlying mechanism is that the raise in temperature creates enough thermally generated charge carriers which fill, or neutralize, the deep level charge centres. Once filled and neutralized, these deep level trap centers can no longer pose impediment to free movement of charge carriers and hence will not create space charge polarization issues.

Several studies have also explored the possibility of eliminating the space charge effects by illuminating with sub-band gap or above band gap wavelength lights. A. L. Washington et al., "Response of the Internal Electric Field in CdZnTe to Illumination at Multiple Optical Powers"; Journal of Electronic Materials, Volume 41, Issue 10, pp. 2874-2879 (2012) reported manipulation of the internal electric field of CZT using multiple wavelengths of light at various optical power settings. The use of multiple optical power levels allows the internal electric field or polarization to be gradually controlled and observed. The internal electric field was shown through the polarization in the infrared (IR) transmission image under illumination as observed by the Pockels set up. J. Franc et al, "Control of electric field in CdZnTe radiation detectors by above-bandgap light", Journal of Applied Physics 117, 165702; doi: 10.1063/1.4919073 (2015) investigated the effects of illumination with sub-bandgap and above band gap wavelength lights on the polarisation and depolarisation effects of CZT detectors.

Crystals having cubic symmetry such as CdTe and CZT are piezoelectric. The piezoelectric constant $d_{14}$ for CdTe has been reported to be 1.54 C/N by D. Berlincourt et al. "Electroelastic Properties of the Sulfides, Selenides, and Tellurides of Zinc and Cadmium", Phys. Rev. 129, 1009 (1963). Due to the converse piezoelectric effect, a voltage applied to the modulator will induce strain in the crystal lattice. When operated below the first resonance frequency, the lattice is free to move with the applied field and this frequency range is termed 'unclamped.' The electro optic coefficient will then have contributions from the linear electro optic effect and the elasto-optic effect and can be expressed as: $r_{41}'=r_{41}+p_{44}d_{14}$, where $r_{41}$ is the linear electrooptic coefficient measured at 'clamped' condition above the first resonant frequency, $p_{44}$ is the elasto-optic coefficient and $d_{14}$ is the piezoelectric coefficient. The values of $r_{41}'$ and $r_{41}$ are reported to be in the range of 5.4-5.8 pm/V and 3.8-4.2 pm/V, respectively by G. L. Herrit and Herman E. Reedy, "Measurement of the electro-optic coefficient for Gallium Arsenide and Cadmium Telluride modulator rods"; Materials Research Society Symposium Proceedings, Vol. 152, pp. 152-169 (1989).

Other publications which discuss general operational properties of electro-optic modulators and metal-semiconductor contacts include: R. O. Bell, "Review of optical applications of CdTe"; Revue de Physique Appliquee, 12 (2), pp. 391-399, (1977); L. J. Brillson in "Surfaces and Interfaces of Electronic Materials" WILEY-VCH, ISBN: 978-3-527-40915-0, pp. 19-63 (2010); S. Li et al., "Optimizing CdTe-metal interfaces for high performance solar cells"; Journal of Materials Chemistry A, 5, pp. 7118-7124 (2017); D. Odkhuu et al., "Atomic and electronic structure of CdTe/metal (Cu, Al, Pt) interfaces and their influence to the Schottky barrier"; Journal of Applied Physics 120, pp. 185703-1-185703-8 (2016); and J. P. Ponpon, "A Review of ohmic and rectifying contacts on Cadmium Telluride"; Solid State Electronics, Vol. 28, No. 7, pp. 689-706 (1985). All of the various cited publications are incorporated herein by reference in their entirety.

SUMMARY

According to an aspect of the present disclosure, an electro-optic modulator made of cadmium zinc telluride single crystal ($Cd_{1-x}Zn_xTe$ where x ranges from 0.0 to 0.15) operating in the infrared ranges from 1 micron to 25 microns is provided. High quality crystals with very low deep level trap densities are employed, which do not normally exhibit a space charge induced polarization effects in the crystal bulk when operated in the band edge wavelengths. The present invention provides enhanced electro-optic modulation on such high quality crystals employing metal electrodes having work functions that are compatible with surface states or majority charge carriers of the single crystalline semiconductor material.

According to an aspect of the present disclosure, an electro-optic modulator is provided, which comprises: a doped semiconductor crystal having a crystallographic surface having an amplitude modulation orientation; a first metal electrode located on a first surface of the doped semiconductor crystal; a second metal electrode located on a second surface of the doped semiconductor crystal; and accumulation space charge regions located within surface regions of the doped semiconductor crystal that are proximal to the first metal electrode and the second metal electrode and including excess charge carriers of a same type as majority charge carriers of the doped semiconductor crystal.

According to another aspect of the present disclosure, a method of manufacturing an electro-optic modulator is provided, which comprises: providing a doped semiconductor crystal having a crystallographic surface having an amplitude modulation orientation; forming a first metal electrode on a first surface of the doped semiconductor crystal; and forming a second metal electrode on a second surface of the doped semiconductor crystal. Accumulation space charge regions are formed within surface regions of the doped semiconductor crystal that are proximal to the first metal electrode and the second metal electrode; and the accumulation space charge regions include excess charge carriers of a same type as majority charge carriers of the doped semiconductor crystal.

upon application of an external voltage source (304) according to an embodiment of the present disclosure.

Figure 6A:
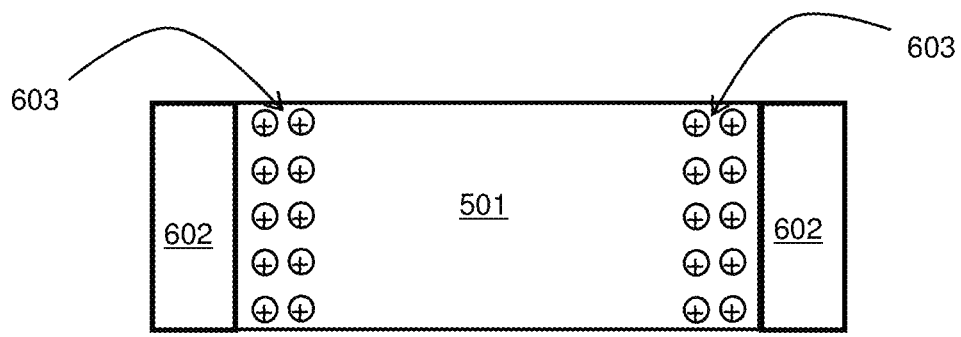
FIG. 6A is a schematic representation illustrating accumulation space charge regions (603) in the case of a p-type semiconductor crystal (501) with metal electrodes (602) having work function higher than the electron affinity of the p-type semiconductor crystal (501) according to an embodiment of the present disclosure.
Figure 6B:
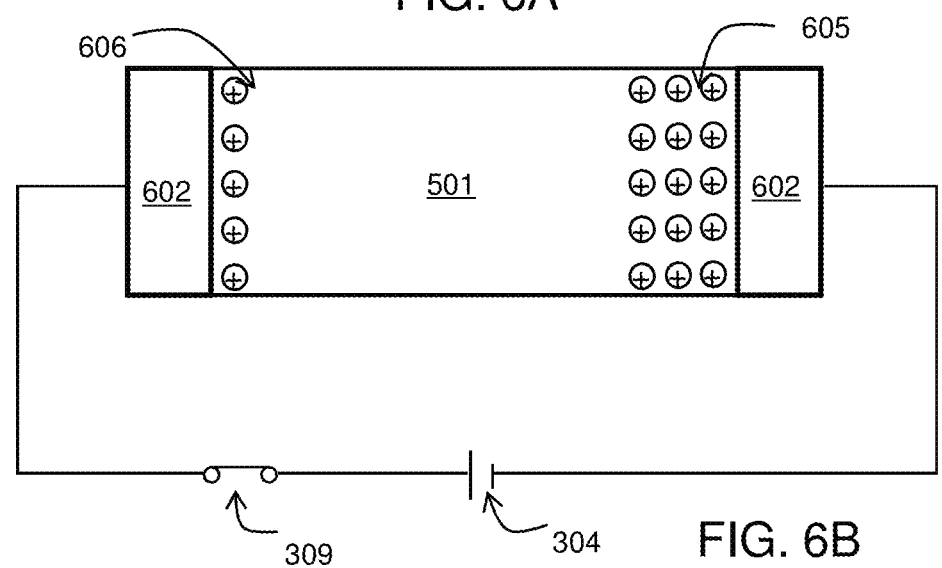
FIG. 6B is a schematic representation illustrating the changes in the accumulation space charge regions (603) on the negative terminal (605) and the positive terminal (606)
Figure 6C:
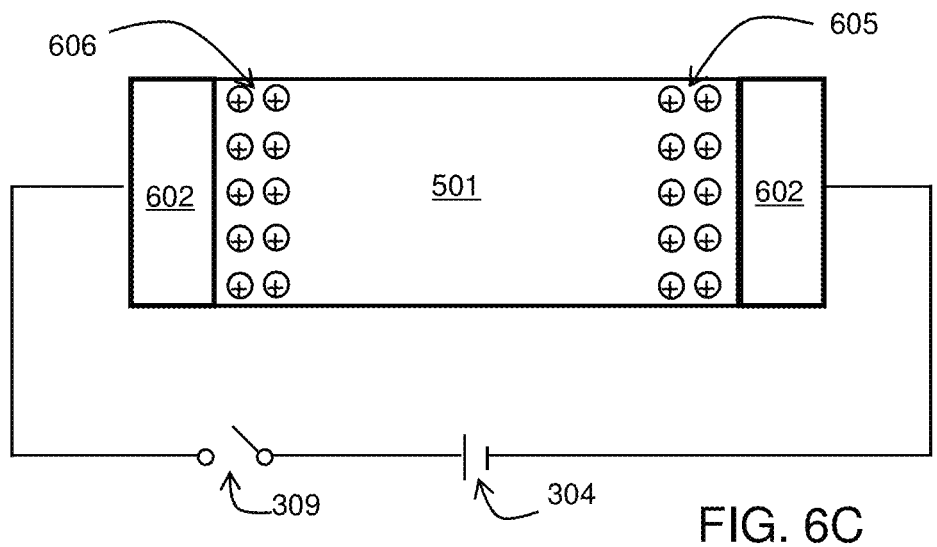

FIG. 6C is a schematic representation depicting the absence of any built-in potential set up across the p-type semiconductor crystal that opposes the applied electric field according to an embodiment of the present disclosure.

Figure 7:
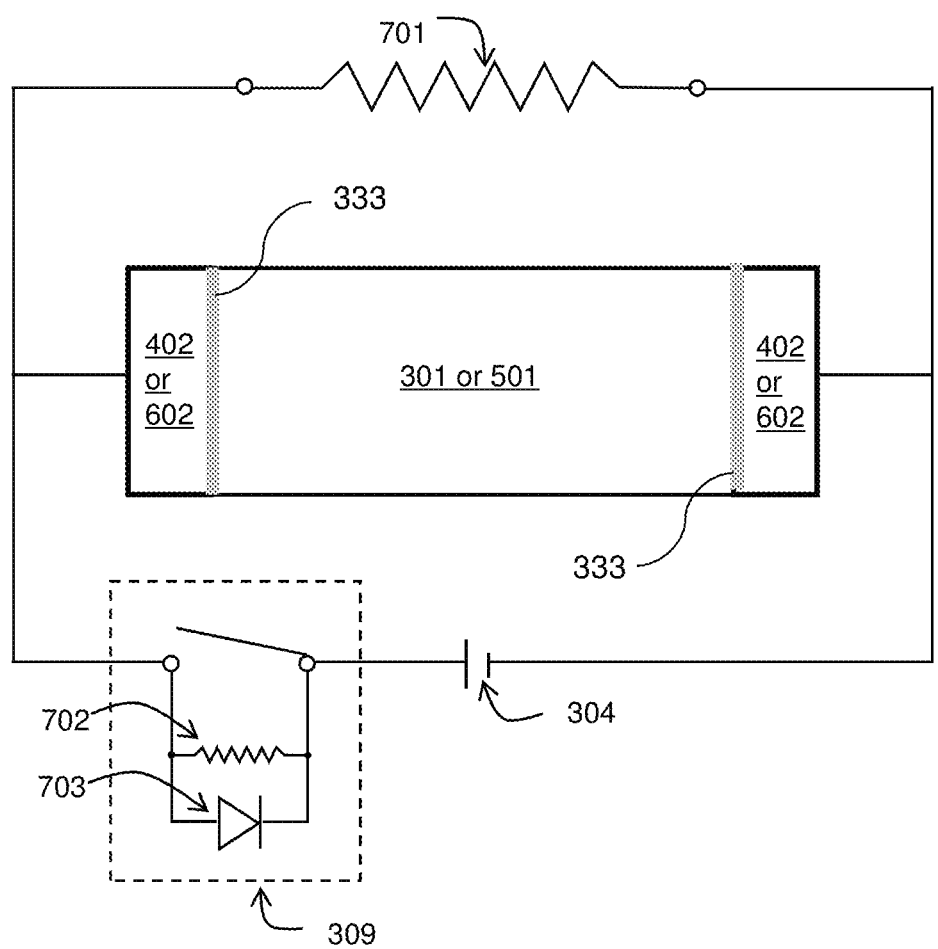

FIG. 7 is a schematic representation of the modulator with an external resistor (701) connected in parallel to the modulator to provide a quick conduction path for the surface space charges according to an embodiment of the present disclosure.

DETAILED DESCRIPTION

As discussed above, the present disclosure is directed to electro-optic switches employing a semiconductor crystal such as cadmium telluride or cadmium zinc telluride, the various aspects of which are described herein with reference to the drawings.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Any reference to claim elements in the singular, for example, using the articles "a," "an," or "the" is not to be construed as limiting the element to the singular. The terms "example," "exemplary," or any term of the like are used herein to mean serving as an example, instance, or illustration. References to particular examples and implementations are for illustrative purposes, and are not intended to limit the scope of the invention or the claims. Any implementation described herein as an "example" is not necessarily to be construed as preferred or advantageous over another implementation. The drawings are not drawn to scale. Multiple instances of an element may be duplicated where a single instance of the element is illustrated, unless absence of duplication of elements is expressly described or clearly indicated otherwise.

The extinction ratio is an important metric of the modulators, which is defined in these claims as the ratio between the output intensities in one on/off cycle of the applied electrical modulating voltage signal. If $I_m$ is the output intensity when the applied voltage is maximum and $I_o$ is the output intensity with no applied voltage, then the extinction ratio is defined as: $\eta = I_m/I_o$.

The state of the art knowledge in this area dictates that the extinction ratio is mainly dependant on the following crystal material factors: (1). stress induced birefringence causing a steady optical leakage with no applied electric field; (2). lattice defects which create energy levels in the forbidden gap of the semiconductor and act as charge carrier traps with de-trapping time greater than the modulating time period; and (3). Birefringence induced by the indirect elasto-optic effect which occurs as the result of piezo-electric and electro-optic effect in succession.

In the course of the research leading to the present invention, the inventors recognized that the nature of the metal semiconductor junction making the electrical contact between the applied voltage supply and the modulator surface, which has been hitherto neglected, is an important factor that can greatly contribute to the extinction ratio. In this regard, the inventors observed that such electro-optic semiconductor crystals, when operated with metallic contacts that are not compatible with the type of the majority carriers of the semiconductor crystal, exhibit an optical leakage effect after the applied bias voltage is cut-off. Furthermore, the inventors discovered that such an effect is due to the build-up of a depletion region on an electrode-semiconductor interface and deeper into the bulk of the semiconductor crystal, which persists even after the applied electric field is switched-off.

Figure 1:
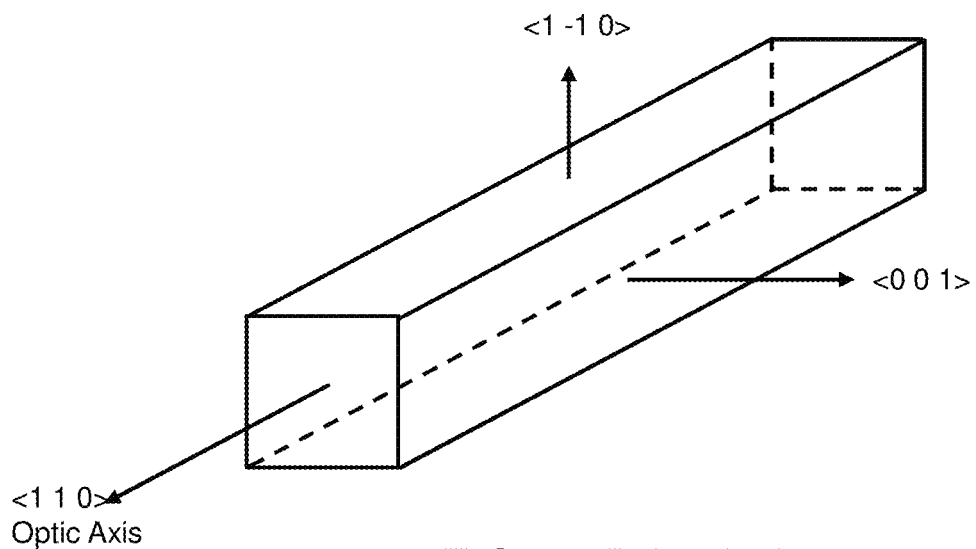
FIG. 1 illustrates first exemplary crystallographic directions and planes of a first amplitude modulation cut, i.e., AM cut 1.
Figure 2:
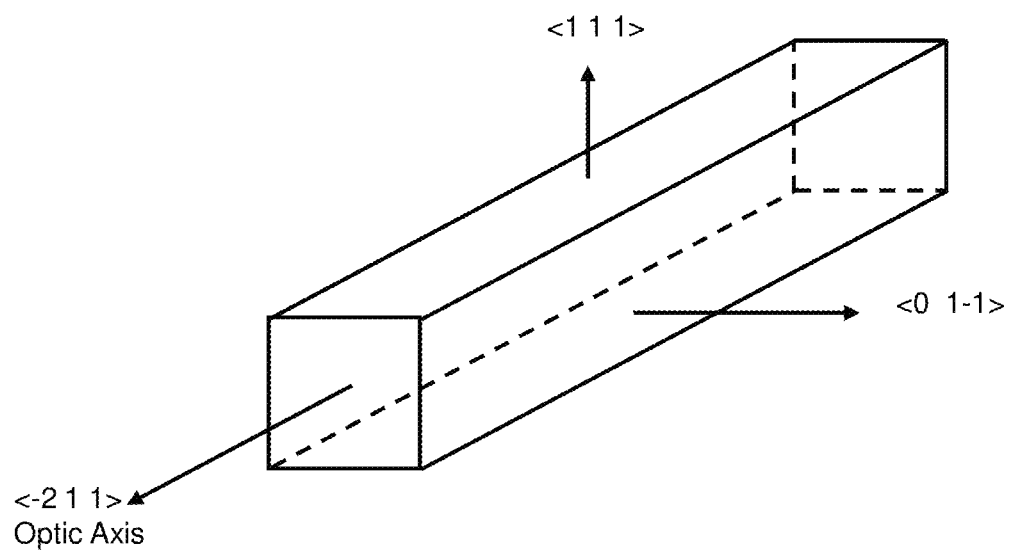
FIG. 2 illustrates second exemplary crystallographic directions and planes of a second amplitude modulation cut, i.e., AM cut 2.
Figure 3A:
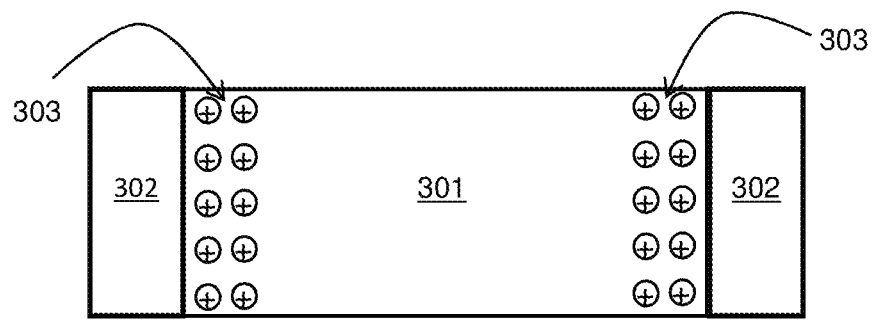
FIG. 3A is a schematic representation illustrating depletion space charge regions (303) in an n-type semiconductor crystal (301) with metal electrodes (302) having work function higher than the electron affinity of the n-type semiconductor crystal according to an embodiment of the present disclosure.

Referring to FIG. 3A, when a modulator crystal is an n-type semiconductor crystal (301), a metal electrode (302) having a work function ($\Phi_M$) greater than the electron affinity of the crystal material ($\chi_S$) and formed on the n-type semiconductor crystal (301) generates a positive space charge region (303), i.e., positively charged ions depleted of electrons, under the crystal surface. Electron affinity refers to the amount of energy released when an electron is added to a neutral atom to form a negative ion. Generation of the positive space charge region (303) occurs due to flow of electrons from the crystal lattice or the conduction band of the n-type semiconductor crystal (301) into the metal electrode (302) when the contact is formed.

Figure 3B:
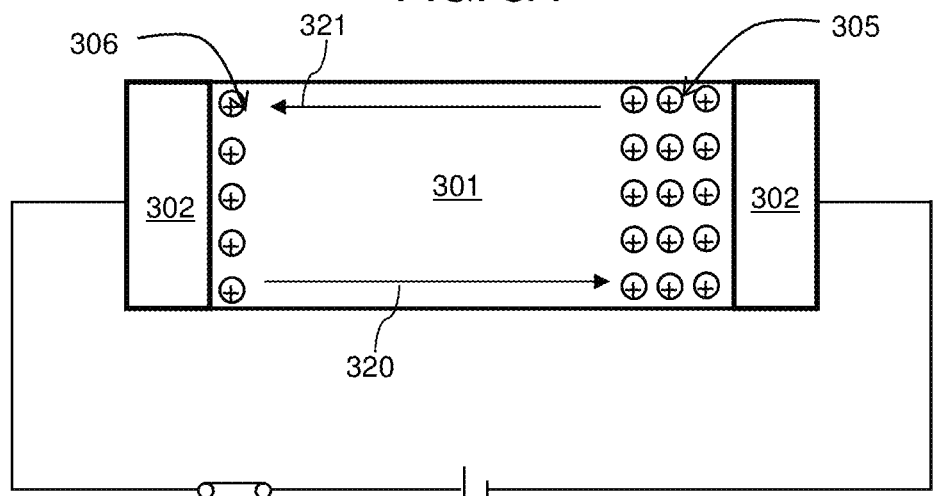
FIG. 3B is a schematic representation illustrating the changes in the depletion space charge regions on the negative terminal (305) and the positive terminal (306) upon application of an external bias voltage employing an external voltage source (304) according to an embodiment of the present disclosure.

Referring to FIG. 3B, when an external electric field is applied to a modulator with such metal-semiconductor junctions, for example, by an external voltage source 304 and a switching circuit (309), the depletion layer widens at the negative terminal (305) (thereby providing a reverse bias to a rectifying contact) and narrows at a positive terminal (306) (thereby providing a forward bias to a rectifying contact). The current flow is very small and is controlled by the characteristics of the reverse-biased rectifying contact. Due to the differences in the relative magnitudes of the space charges on the two terminals, a built-in potential (320) is set-up across the electro-optic modulator. The direction of this built-in potential (from low voltage to high voltage) is the same as the direction of the applied electric field. The direction of a built-in electrical field (321) induced by the built-in potential (320) is the opposite of the direction of the applied electric field.

Figure 3C:
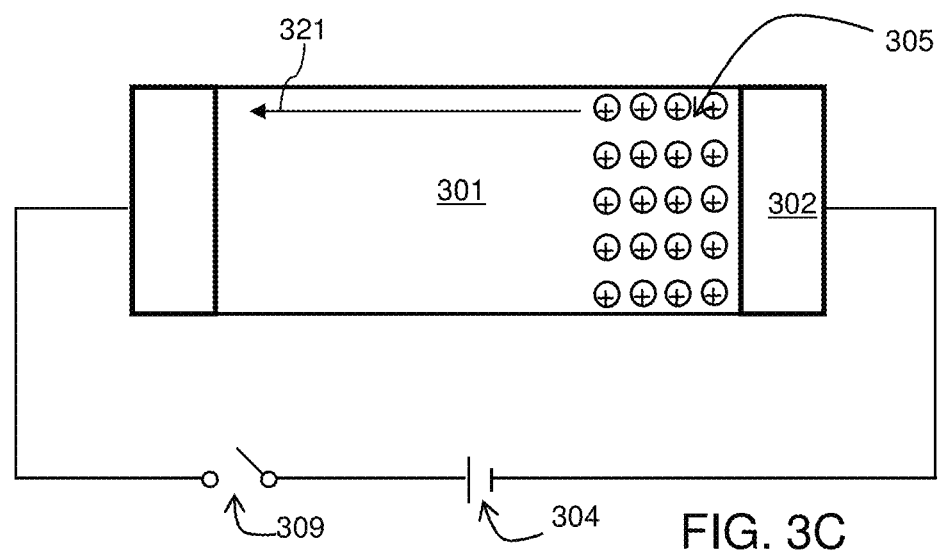
FIG. 3C is a schematic representation illustrating a built-in field (321) set up across the semiconductor crystal in opposite direction to the applied electric field according to an embodiment of the present disclosure.

Referring to FIG. 3C, the built-in electric field (321) persists even after the applied electric field is switched-off until the accumulated electrical charges dissipate and reach an equilibrium condition illustrated in FIG. 3A. Consequently, the modulator will continue to be birefringent until the internal space charges decay slowly to the ground potential with a time constant ranging from nanoseconds to milliseconds after the external electric field is turned off. Furthermore, due to piezoelectric nature of the crystal, during the maximum of the applied voltage pulse, the electro-optic modulator undergoes an expansion in the applied field direction by means of the 'converse-piezoelectric effect.' When the pulse field is in the 'off' state, the electro-optic modulator contracts back to the original dimensions. The high voltage pulse hence sets the modulator bar into physical vibration. The contraction and expansion cause space charges to be developed at the crystal surfaces by the 'direct piezoelectric effect.' The polarity of the piezoelectricity induced space charges will be in opposite direction to the applied field and hence in the same direction as the built-in electric field.

Figure 4A:
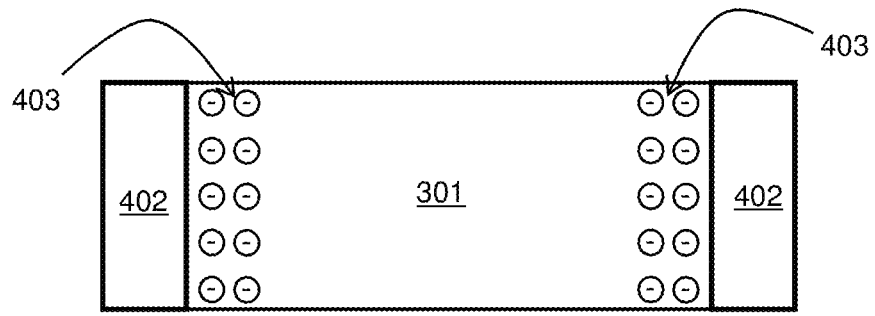
FIG. 4A is a schematic representation illustrating accumulation space charge regions (403) in the case of an n-type semiconductor crystal (301) with metal electrodes (402) having a work function lower than the electron affinity of the n-type semiconductor crystal according to an embodiment of the present disclosure.

Referring to FIG. 4A, if the work function of the metal electrode (402) is lower than the electron affinity of the n-type semiconductor crystal (301), then during the formation of the contact, electrons will flow from the metal electrodes (402) into the n-type semiconductor crystal (301), thereby forming an accumulation region (403) consisting of negatively charged ions.

Figure 4B:
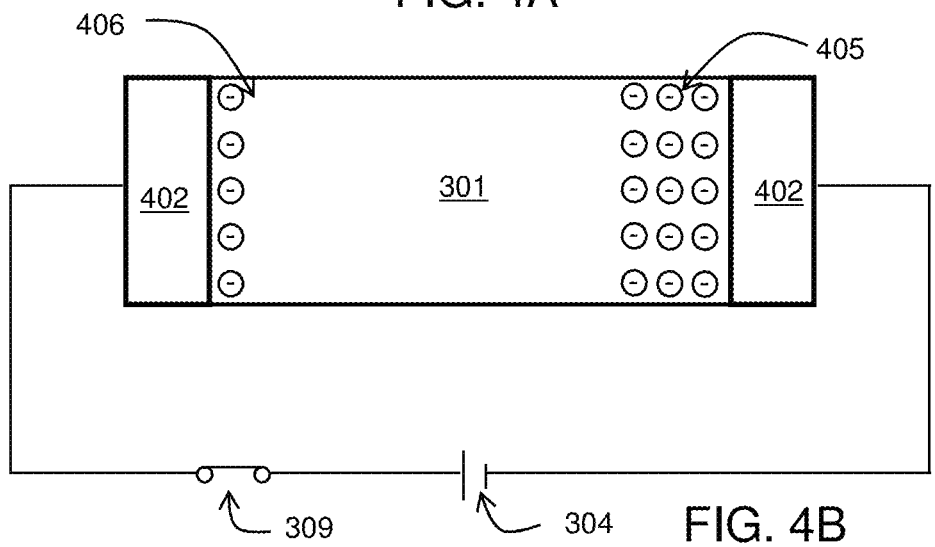
FIG. 4B is a schematic representation illustrating the nature of the changes in the accumulation space charge regions on the negative terminal (405) and the positive terminal (406) on application of an external voltage source (304) according to an embodiment of the present disclosure.
Figure 4C:
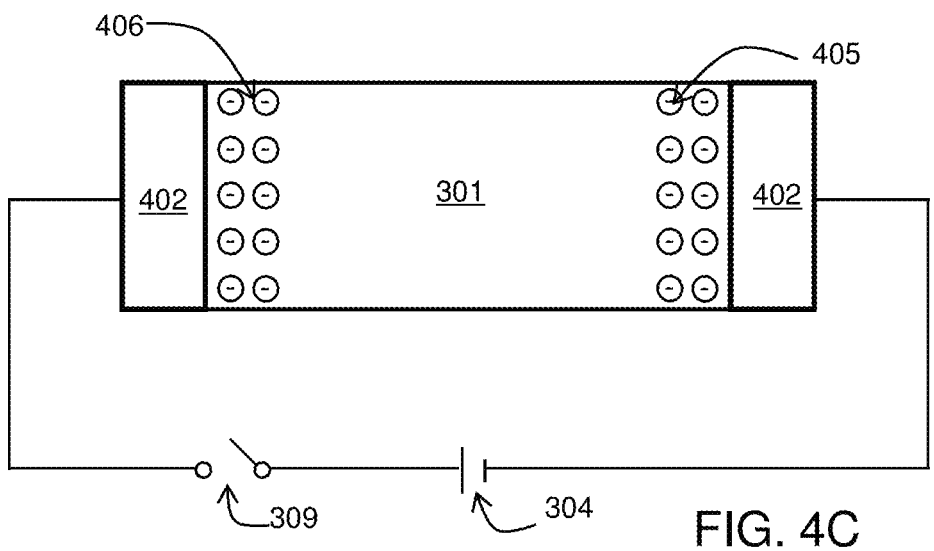
FIG. 4C is a schematic representation depicting the absence of any built-in potential set up across the n-type semiconductor crystal that opposes the applied electric field according to an embodiment of the present disclosure.

Referring to FIGS. 4B and 4C, formation of a majority carrier type accumulation region on the sub-surface region of the n-type semiconductor crystal allows free flow of electron current across both of the metal-semiconductor junctions. In other words, the metal-semiconductor junctions function as Ohmic junctions in this case. The piezo-electricity induced charges can also flow out of the crystal surfaces without any barrier. Transient optical effects observed in the device of FIGS. 3A-3C are absent in the device of FIGS. 4A-4C. The change in the extinction ratio of the electro-optic switch of FIGS. 4A-4C upon switching is almost instantaneous, and can occur within 10 nanoseconds, such as within 1 nanosecond, within actuation of the switching circuit (309).

Figure 5A:
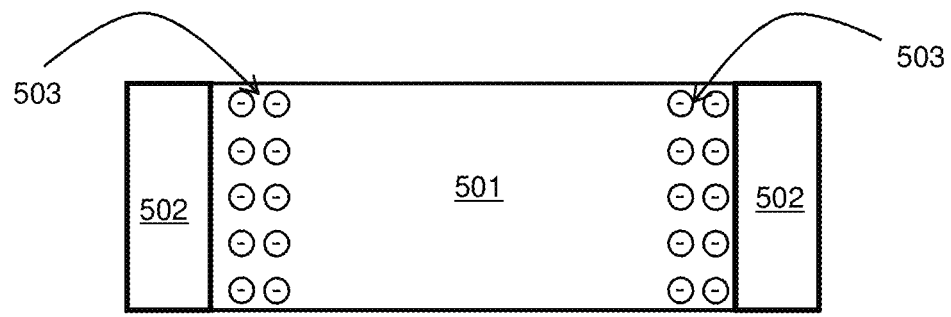
FIG. 5A is a schematic representation illustrating depletion space charge regions (503) in the case of a p-type semiconductor crystal (501) with metal electrodes (502) having work function lower than the electron affinity of the semiconductor according to an embodiment of the present disclosure.

Referring to FIG. 5A, when the modulator crystal is a p-type semiconductor crystal (501), formation of a metal electrode (502) whose work function ($\Phi_M$) is lower than that of the electron affinity of the crystal material ($\chi_S$) results in a negative space charge region (503) consisting of negatively charged ions under the crystal surface. This occurs due to flow of holes from the valence band of the semiconductor into the valance states of the metal of the metal electrodes (502) when the contact is formed.

Figure 5B:
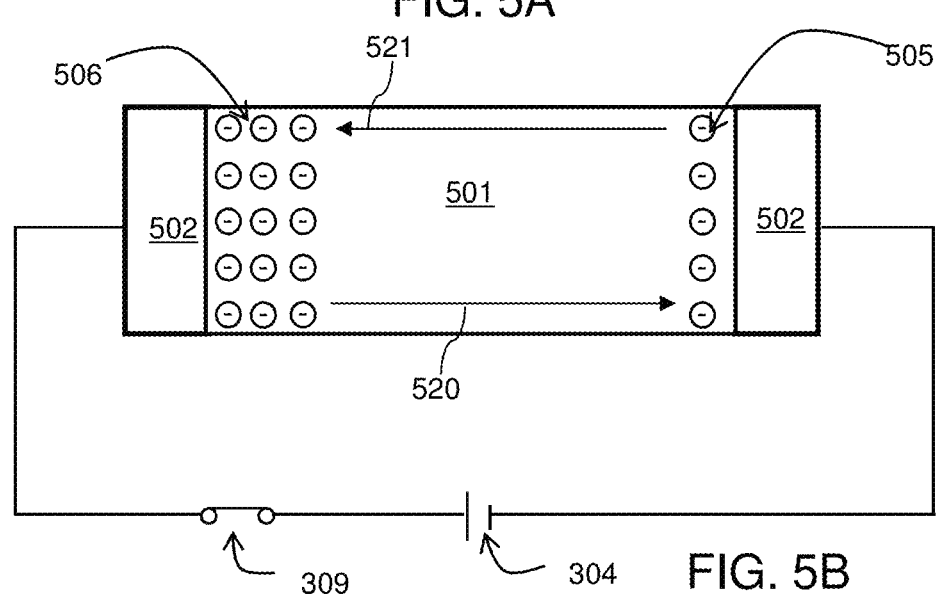
FIG. 5B is a schematic representation illustrating the changes in the depletion space charge regions (503) on the negative terminal (505) and the positive terminal (506) upon application of an external voltage source (304) according to an embodiment of the present disclosure.

Referring to FIG. 5B, when an external electric field is applied to an electro-optic modulator with such metal-semiconductor junctions, the depletion layer (i.e., the negative space charge region (503)) widens at the positive terminal (506) (thereby providing a reverse bias to a rectifying contact) and the narrows at a negative terminal (503) (thereby providing a forward bias to a rectifying contact). The flow of current is very small and is controlled by the characteristics of the reversed-biased rectifying contact. Due to the differences in the relative magnitudes of the space charges on the two terminals, a built-in potential (520) is set-up across the electro-optic modulator. The direction of this built-in potential (from low voltage to high voltage) is the same as the direction of the applied electric field. The direction of a built-in electrical field (521) induced by the built-in potential (520) is the opposite of the direction of the applied electric field.

Figure 5C:
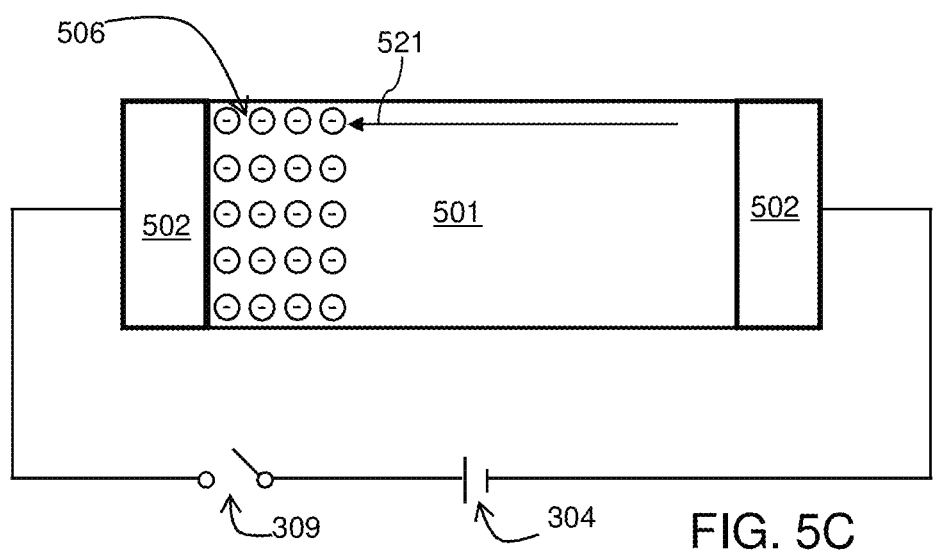
FIG. 5C is a schematic representation illustrating a built-in field (521) set up across the p-type semiconductor crystal according to an embodiment of the present disclosure.

Referring to FIG. 5C, the built-in electric field (521) persists even after the applied electric field is switched-off until the accumulated electrical charges dissipate and reach an equilibrium condition illustrated in FIG. 5A. Consequently, the modulator will continue to be birefringent until the internal space charges decay slowly to the ground potential with a time constant ranging from nanoseconds to milliseconds after the external electric field is turned off. Furthermore, due to piezoelectric nature of the crystal, during the maximum of the applied voltage pulse, the electro-optic modulator undergoes an expansion in the applied field direction by means of the 'converse-piezoelectric effect.' When the pulse field is in the 'off' state, the electro-optic modulator contracts back to the original dimensions. The high voltage pulse hence sets the modulator bar into physical vibration. The contraction and expansion cause space charges to be developed at the crystal surfaces by the 'direct piezoelectric effect.' The polarity of the piezoelectricity induced space charges will be in opposite direction to the applied field and hence in the same direction as the built-in electric field.

Referring to FIG. 6A, if the work function of the metal electrodes (602) is higher than the electron affinity of the p-type semiconductor crystal (501), a hole current flows during the formation of the metal contact from the valence states of the metal of the metal electrodes (602) into the valance band of the p-type semiconductor crystal (501).

Referring to FIGS. 6B and 6C, formation of an accumulation region (603) in the crystal sub-surface region allows free flow of hole current across both metal-semiconductor junctions. The metal-semiconductor junctions function as Ohmic junctions in this case. The piezo-electricity induced charges can also flow out of the crystal surfaces without any barrier. Transient optical effects observed in the device of FIGS. 5A-5C are absent in the device of FIGS. 6A-6C. The change in the extinction ratio of the electro-optic switch of FIGS. 6A-6C upon switching is almost instantaneous, and can occur within 10 nanoseconds, such as within 1 nanosecond, within actuation of the switching circuit (309).

Furthermore, in the case of semiconductors such as CdTe and CZT, the presence of a high density of surface states greatly influence the electrical nature of the metal-semiconductor junctions. Chemical treatments can be employed to alter the surface reconstruction, Fermi level pinning, and metal induced states at the metal-semiconductor junctions. These surface treatments can influence the behaviour of the metal-semiconductor junctions and improve its Ohmicity or rectification characteristics.

Generally, it is easier to form Ohmic contacts with n-type CdTe or n-type CZT rather than with p-type CdTe or with p-type CZT. This is illustrated by the lower Schottky barrier heights ($\Phi_{Bn}=\Phi_M-\chi_S$) for electron transport for the low work function metals such as Al and Ag compared to the higher Schottky barrier heights ($\Phi_{Bp}=E_g-\Phi_M+\chi_S$) for hole transport for high work function metals such as Ni and Au.

Furthermore, the crystallographic orientations of the semiconductor's surface greatly influence the surface reconstruction, surface states and the Schottky barrier height. In the case of the <111> surfaces, the Te terminated face exhibits acceptor type surface states and Ohmic conductivity, while the Cd terminated face exhibits donor type surface states and rectifying behaviour with considerable Schottky barrier height.

The inventors have discovered that when a metal-semiconductor contact that is not compatible with the conductivity type of a semiconductor crystal and the nature of the surface states of the semiconductor crystal is employed as illustrated in FIGS. 3A-3C and FIGS. 5A-5C, the metal-semiconductor contact is rendered rectifying in nature. The buildup of the positive space charges on the cathode terminal surface region (i.e., the surface region proximal to the negative terminal (305)) of the n-type semiconductor crystal (301) in the modulator blocks electrical charges from flowing freely in and out of the n-type semiconductor crystal (301) as illustrated in FIGS. 3B and 3C. The buildup of the negative space charges on the anode terminal surface region (i.e., the surface region proximal to the positive terminal (506)) of the p-type semiconductor crystal (501) in the modulator blocks electrical charges from flowing freely in and out of the p-type semiconductor crystal (501) as illustrated in FIGS. 5B and 5C.

During the 'on' time of the external bias, (1) the semiconductor crystal is birefringent due to linear electro-optic effect, and (2) the semiconductor crystal will change in dimensions due to the converse piezoelectric effect. When the external electric field is turned off, (1) the residual internal electric field produced by internal space charges will decay slowly with time constants ranging from nanoseconds to milliseconds, and (2) an acoustic shock wave or vibration will be set up in the modulator bar due to the piezoelectric effect. The surface charges induced by the piezoelectric effect are added to the existing space charges. As a result, the electro-optic modulator continues to be birefringent, resulting in the leakage of the optical radiation in a range from about 0.1% to about 1% during the off time of the modulating electric signal. Such effects thus reduce the extinction ratio of the electro-optic modulator when operated at modulating frequencies, which can be, for example, in a range from 10 kHz to 50 kHz.

The inventors have further discovered that when metallic contacts compatible with the conductivity type and the nature of the surface states of the semiconductor crystal are employed as illustrated in FIGS. 4A-4C and 6A-6C, the contacts are rendered Ohmic and buildup of space charges on the modulator crystal terminals does not occur. This will allow the electrical charges to flow freely in and out of the crystal, thus resulting in a higher extinction ratio for incoming signals.

Referring to FIG. 7, an embodiment of the present disclosure is illustrated, in which the detrimental effects of non-compatibility of the semiconductor-metal contacts can be greatly minimized by connecting a resister (701) having resistance not greater than the effective resistance of the modulator in parallel to the modulator. The resistance of the resistor (701) can be optimized taking into consideration the effective open circuit resistance of a switching circuit (309) of the power supply. The switching circuit (309) can include, for example, a switching circuit resistor (702) and a switching circuit diode (703) that are connected to a switch in a parallel connection. The lowest value for the resistance of the resistor (701) can be limited by the maximum current that can be supplied by the power source, i.e., the external voltage source (304).

Optionally, at least one interfacial oxide layer (333) can be formed by treating at least one of the first and second surfaces of the doped semiconductor crystal (301 or 502) with a chemical solution of sodium hypochloride. The at least one interfacial oxide layer (333) comprises an oxide of cadmium telluride or an oxide of cadmium zinc telluride, and reduces Schottky barrier height between the doped semiconductor crystal (301 or 501) and at least one of the first and second metal electrodes (402 or 602).

According to an aspect of the present disclosure, an electro-optic modulator is provided, which comprises: a doped semiconductor crystal (301 or 501) having a crystallographic surface having an amplitude modulation orientation; a first metal electrode (402 or 602) located on a first surface of the doped semiconductor crystal (301 or 501); a second metal electrode (402 or 602) located on a second surface of the doped semiconductor crystal (301 or 501); and accumulation space charge regions (403 or 603) located within surface regions of the doped semiconductor crystal (301 or 501) that are proximal to the first metal electrode (402 or 602) and the second metal electrode (402 or 602) and including excess charge carriers of a same type as majority charge carriers of the doped semiconductor crystal (301 or 501).

In one embodiment, the doped semiconductor crystal (301 or 501) has a shape of a bar of a uniform cross-sectional shape within cross-sectional planes that are perpendicular to a lengthwise direction; a length of the bar is in a range from 25 mm to 100 mm; and the uniform cross-sectional shape has an area in a range from 6.25 mm$^2$ to 100 mm$^2$.

In one embodiment, the first surface and the second surface of the doped semiconductor crystal are two (1$\bar{1}$0) surfaces of the bar. In another embodiment, the first surface and the second surface of the doped semiconductor crystal are two (111) surfaces of the bar. In one embodiment, the bar has a shape of a rectangular prism; and at least two side surfaces of the bar that are perpendicular to the first and second surfaces have an optical surface finish.

In one embodiment, the doped semiconductor crystal comprises $Cd_{1-x}Zn_xTe$ in which x have a value in a range from, and including, 0.0 to, and including, 0.15. In one embodiment, the doped semiconductor crystal has electrical resistivity in the range from $1.0 \times 10^8$ Ω·cm to $1.0 \times 10^{11}$ Ω·cm.

In one embodiment, the doped semiconductor crystal (301) has an n-type doping; and the first and second metal electrodes (402) comprise a respective metal having a respective work function that is lower than electron affinity of the doped semiconductor crystal (301). In one embodiment, each of the first and second metal electrodes (402) comprises a metal selected from indium, aluminum, and silver.

In one embodiment, the doped semiconductor crystal (501) has a p-type doping; and the first and second metal electrodes (602) comprise a respective metal having a respective work function that is higher than electron affinity of the doped semiconductor crystal. In one embodiment, each of the first and second metal electrodes (602) comprises a metal selected from gold, platinum, and nickel.

In one embodiment, the electro-optic modulator comprises at least one interfacial oxide layer (333) located between the doped semiconductor crystal (301 or 501) and one of the first and second metal electrodes (402 or 602) and providing reduction in Schottky barrier height. The at least one interfacial oxide layer (333) comprises an oxide of cadmium telluride or an oxide of cadmium zinc telluride.

In one embodiment, the electro-optic modulator further comprises a resistor (701) in a parallel connection with the doped semiconductor crystal (301 or 501) and providing a conduction path for surface space charges of the doped semiconductor crystal (301 or 501) for a quick discharge upon switching. In one embodiment, an extinction coefficient of the doped semiconductor crystal (301 or 501) transitions at least by 90%, (such as by 99% or more) of a difference between an on-value and an off-value of the extinction coefficient within 1 nanosecond of switching of the electro-optic modulator.

According to another aspect of the present disclosure, a method of manufacturing an electro-optic modulator is provided, which comprises: providing a doped semiconductor crystal (301 or 501) having a crystallographic surface having an amplitude modulation orientation; forming a first metal electrode (402 or 602) on a first surface of the doped semiconductor crystal (301 or 501); and forming a second metal electrode (402 or 602) on a second surface of the doped semiconductor crystal (301 or 501). Accumulation space charge regions (403 or 603) are formed within surface regions of the doped semiconductor crystal (301 or 501) that are proximal to the first metal electrode (402 or 602) and the second metal electrode (402 or 602); and the accumulation space charge regions (403 or 603) include excess charge carriers of a same type as majority charge carriers of the doped semiconductor crystal.

In one embodiment, the doped semiconductor crystal (301 or 501) has a shape of a bar of a uniform cross-sectional shape within cross-sectional planes that are perpendicular to a lengthwise direction (i.e., a direction connecting the first metal electrode and the second metal electrode), a length of the bar is in a range from 25 mm to 100 mm, and the uniform cross-sectional shape has an area in a range from 6.25 mm$^2$ to 100 mm$^2$. In one embodiment, the first surface and the second surface of the doped semiconductor crystal are two (1$\bar{1}$0) surfaces of the bar, or are two (111) surfaces of the bar.

In one embodiment, the bar has a shape of a rectangular prism, and the method further comprises providing optical surface finish to at least two side surfaces of the bar that are perpendicular to the first and second surfaces. In one embodiment, the optical surface finish to at least two side surfaces of the bar is provided by lapping and polishing the at least two side surfaces of the bar employing alumina slurry having an average particle size in a range from 25 nanometers to 100 nanometers.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

The invention claimed is:

1. An electro-optic modulator comprising:
    a doped semiconductor crystal having a crystallographic surface having an amplitude modulation orientation;
    a first metal electrode located on a first surface of the doped semiconductor crystal;
    a second metal electrode located on a second surface of the doped semiconductor crystal; and
    accumulation space charge regions located within surface regions of the doped semiconductor crystal that are proximal to the first metal electrode and the second metal electrode and including excess charge carriers of a same type as majority charge carriers of the doped semiconductor crystal.

2. The electro-optic modulator of claim 1, wherein:
    the doped semiconductor crystal has a shape of a bar of a uniform cross-sectional shape within cross-sectional planes that are perpendicular to a lengthwise direction;
    a length of the bar is in a range from 25 mm to 100 mm; and
    the uniform cross-sectional shape has an area in a range from 6.25 mm$^2$ to 100 mm$^2$.

3. The electro-optic modulator of claim 2, wherein the first surface and the second surface of the doped semiconductor crystal are two ($1\bar{1}0$) surfaces of the bar.

4. The electro-optic modulator of claim 2, wherein the first surface and the second surface of the doped semiconductor crystal are two (111) surfaces of the bar.

5. The electro-optic modulator of claim 2, wherein:
    the bar has a shape of a rectangular prism; and
    at least two side surfaces of the bar that are perpendicular to the first and second surfaces have an optical surface finish.

6. The electro-optic modulator of claim 1, wherein the doped semiconductor crystal comprises $Cd_{1-x}Zn_xTe$ in which x have a value in a range from, and including, 0.0 to, and including, 0.15.

7. The electro-optic modulator of claim 1, wherein the doped semiconductor crystal has electrical resistivity in the range from $1.0\times10^8$ Ω·cm to $1.0\times10^{11}$ Ω·cm.

8. The electro-optic modulator of claim 1, wherein:
    the doped semiconductor crystal has an n-type doping; and
    the first and second metal electrodes comprise a respective metal having a respective work function that is lower than electron affinity of the doped semiconductor crystal.

9. The electro-optic modulator of claim 8, wherein each of the first and second metal electrodes comprises a metal selected from indium, aluminum, and silver.

10. The electro-optic modulator of claim 1, wherein:
    the doped semiconductor crystal has a p-type doping; and
    the first and second metal electrodes comprise a respective metal having a respective work function that is higher than electron affinity of the doped semiconductor crystal.

11. The electro-optic modulator of claim 10, wherein each of the first and second metal electrodes comprises a metal selected from gold, platinum, and nickel.

12. The electro-optic modulator of claim 1, further comprising at least one interfacial oxide layer located between the doped semiconductor crystal and one of the first and second metal electrodes and providing reduction in Schottky barrier height, wherein the at least one interfacial oxide layer comprises an oxide of cadmium telluride or an oxide of cadmium zinc telluride.

13. The electro-optic modulator of claim 1, further comprising a resistor in a parallel connection with the doped semiconductor crystal and providing a conduction path for surface space charges of the doped semiconductor crystal.

14. The electro-optic modulator of claim 1, wherein an extinction coefficient of the doped semiconductor crystal transitions at least by 90% of a difference between an on-value and an off-value within 1 nanosecond of switching of the electro-optic modulator.

15. A method of manufacturing an electro-optic modulator, comprising:
    providing a doped semiconductor crystal having a crystallographic surface having an amplitude modulation orientation;
    forming a first metal electrode on a first surface of the doped semiconductor crystal; and
    forming a second metal electrode on a second surface of the doped semiconductor crystal, wherein:
    accumulation space charge regions are formed within surface regions of the doped semiconductor crystal that are proximal to the first metal electrode and the second metal electrode; and
    the accumulation space charge regions include excess charge carriers of a same type as majority charge carriers of the doped semiconductor crystal.

16. The method of claim 15, wherein:
    the doped semiconductor crystal has a shape of a bar of a uniform cross-sectional shape within cross-sectional planes that are perpendicular to a lengthwise direction;
    a length of the bar is in a range from 25 mm to 100 mm; and
    the uniform cross-sectional shape has an area in a range from 6.25 mm$^2$ to 100 mm$^2$.

17. The method of claim 16, wherein the first surface and the second surface of the doped semiconductor crystal are two ($1\bar{1}0$) surfaces of the bar, or are two (111) surfaces of the bar.

18. The method of claim 16, wherein:
    the bar has a shape of a rectangular prism; and
    the method further comprises providing optical surface finish to at least two side surfaces of the bar that are perpendicular to the first and second surfaces.

19. The method of claim 18, wherein the optical surface finish to at least two side surfaces of the bar is provided by lapping and polishing the at least two side surfaces of the bar employing alumina slurry having an average particle size in a range from 25 nanometers to 100 nanometers.

20. The method of claim 15, wherein:
    the doped semiconductor crystal comprises $Cd_{1-x}Zn_xTe$ in which x have a value in a range from, and including, 0.0 to, and including, 0.15; and the doped semiconductor crystal has electrical resistivity in the range from $1.0 \times 10^8$ Ω·cm to $1.0 \times 10^{11}$ Ω·cm.

21. A method of operating the electro-optic modulator of claim 1, comprising switching the electro-optic modulator, wherein an extinction coefficient of the doped semiconductor crystal transitions at least by 90% of a difference between an on-value and an off-value within 1 nanosecond of the switching of the electro-optic modulator.

\* \* \* \* \*